United States Patent
Mizukami

(10) Patent No.: US 8,835,934 B2
(45) Date of Patent: Sep. 16, 2014

(54) SEMICONDUCTOR DEVICE

(75) Inventor: Makoto Mizukami, Kanagawa-ken (JP)

(73) Assignee: Kabushiki Kaishia Toshiba, Tokyo (JP)

( * ) Notice: Subject to any disclaimer, the term of this patent is extended or adjusted under 35 U.S.C. 154(b) by 0 days.

(21) Appl. No.: 13/414,394

(22) Filed: Mar. 7, 2012

(65) Prior Publication Data
US 2012/0223339 A1  Sep. 6, 2012

Related U.S. Application Data

(63) Continuation of application No. PCT/JP2009/004586, filed on Sep. 15, 2009.

(51) Int. Cl.
| | |
|---|---|
| *H01L 29/78* | (2006.01) |
| *H01L 29/47* | (2006.01) |
| *H01L 29/161* | (2006.01) |
| *H01L 29/16* | (2006.01) |
| *H01L 27/098* | (2006.01) |
| *H01L 27/07* | (2006.01) |
| *H01L 29/10* | (2006.01) |
| *H01L 29/417* | (2006.01) |
| *H01L 29/06* | (2006.01) |

(52) U.S. Cl.
CPC ......... *H01L 29/7806* (2013.01); *H01L 29/1608* (2013.01); *H01L 27/098* (2013.01); *H01L 27/0727* (2013.01); *H01L 29/47* (2013.01); *H01L 29/1095* (2013.01); *H01L 29/41766* (2013.01); *H01L 29/0696* (2013.01)
USPC ............. 257/77; 257/341; 257/337; 257/329; 438/237; 438/305

(58) Field of Classification Search
USPC .......... 257/329, 341, 337, 330, 288, 344, 346
See application file for complete search history.

(56) References Cited

U.S. PATENT DOCUMENTS

| 2002/0016062 A1 | 2/2002 | Uno |
| 2004/0021174 A1* | 2/2004 | Kobayashi ................. 257/330 |

(Continued)

FOREIGN PATENT DOCUMENTS

| JP | 2002-043571 | 2/2002 |
| JP | 2002-43571 | 2/2002 |

(Continued)

OTHER PUBLICATIONS

International Preliminary Report on Patentability with Written Opinion issued Mar. 29, 2012 in Application No. PCT/JP2009/004586 (With English Translation).

(Continued)

*Primary Examiner* — Khiem D Nguyen
*Assistant Examiner* — Wilner Jean Baptiste
(74) *Attorney, Agent, or Firm* — Oblon, Spivak, McClelland, Maier & Neustadt, L.L.P.

(57) ABSTRACT

A semiconductor device includes a first conduction type semiconductor substrate, a first conduction type semiconductor deposition layer, a trench, second conduction type wells, a JFET region, a first conduction type first source region, a first source region, a trench-type source electrode, a gate insulator film, a gate electrode, and a drain electrode. The trench is formed substantially perpendicularly to the semiconductor deposition layer so that the semiconductor deposition layer exposes to a bottom of the trench. The second conduction type second source region are formed in the first conduction type first source region. The trench-type source electrode is in contact with the first source region, the second source region, and the first conduction type semiconductor deposition layer to configure a Schottky junction.

13 Claims, 11 Drawing Sheets

(56) References Cited

U.S. PATENT DOCUMENTS

2004/0164304 A1    8/2004   Magri et al.
2005/0280086 A1*  12/2005   Saito et al. .................. 257/341
2006/0138533 A1    6/2006   Hirler et al.
2006/0249785 A1*  11/2006   Bhalla et al. ................. 257/328
2007/0102725 A1    5/2007   Magri' et al.
2009/0173949 A1    7/2009   Yatsuo et al.

FOREIGN PATENT DOCUMENTS

| JP | 2002-299643 | 10/2002 |
|----|-------------|---------|
| JP | 2005-045123 | 2/2005 |
| JP | 2005-45123  | 2/2005 |
| JP | 2005-285913 | 10/2005 |
| JP | 2007-234925 | 9/2007 |

OTHER PUBLICATIONS

Office Action issued on Jan. 30, 2014 in the corresponding Japanese Patent Application No. 2011-531630 (with English Translation).

Japanese Office Action issued Sep. 11, 2013, in Japan Patent Application No. 2011-531630 (with English translation).

* cited by examiner

SEMICONDUCTOR DEVICE

CROSS REFERENCE TO RELATED APPLICATION

This is a Continuation of International Application No. PCT/JP2009/004586 filed on Sep. 15, 2009, entire contents of which are incorporated herein by reference.

FIELD

Embodiments relate basically to a semiconductor device to be used for an inverter etc.

BACKGROUND

A present inverter includes a combination of MOSFET (Metal-Oxide-Semiconductor Field-Effect Transistor) which is a semiconductor device with a switching function and a diode which is a semiconductor device with a rectification function. That is, a switching element and a rectifier are paired with each other to be basically used in the inverter. Furthermore, two or more pairs of the switching element and the rectifier are combined with each other to configure the inverter entirely. However, many elements included in the inverter leads to its cost increase and low reliability.

There has been an attempt to provide a single MOSFET with both the switching function and the rectifying function in a technical field of a switching element, specifically an insulated gate transistor like a MOSFET. Such a single MOSFET includes a p-type region in contact with a source region, an n-type region in contact with a drain region, and a low-concentration n-type drift layer formed between the p-type and n-type regions to form a PiN diode.

However, a PiN diode has a high rising voltage and performs bipolar operation to cause a high switching loss. There is another attempt to replace a built-in diode region of the MOSFET with a Schottky barrier diode (SBD) for lowering a rising voltage and a stationary loss of the MOSFET. The SBD can also reduce the switching loss of the MOSFET owing to unipolar operation of an SBD. The built-in diode region includes the PiN diode having a high rising voltage. However, when an SBD is formed adjacent to a MOSFET to provide a built-in SBD, a unit cell becomes large in size because the unit cell includes the SBD region also, thereby making it difficult to handle large current capacity necessary for an inverter. In addition, an SBD commonly has a low breakdown voltage depending on the shape or position of the SBD in a unit cell, thereby easily causing the breakdown of the SBD whenever a reverse voltage is applied to the SBD.

So, an idea is proposed as follows. Firstly, a trench is formed between adjacent gate electrodes of MOSFETs so that the trench passes through a channel layer between the adjacent gate electrodes. Secondly, a Schottky metal layer is formed inside the trench to configure a built-in SBD in the bottom area of the trench. As a result, the built-in SBD is formed in a diffusion region of the MOSFETs. However, when the Schottky barrier of the SBD is in contact with a drift layer near the drain region, the Schottky barrier is easily subjected to electric field concentration, thereby causing a breakdown of the SBD in some cases before a voltage applied to the SBD reaches the breakdown voltage of the SBD.

In addition, a vertical SiC MOSFET having a built-in SBD is proposed as follows. The material of the SiC MOSFET is SiC (Silicon Carbide). The SBD with a low on-resistance is formed adjacent to the MOSFET by forming a metal electrode on an exposed surface area of the n-type drift layer of the MOSFET to configure the Schottky barrier. However, the unit cell becomes larger in size just for adding the SBD than a unit cell of a previous MOSFET without a built-in SBD. For this reason, the ratio of the area occupied by the vertical MOSFET decreases to cause an increase in the on-resistance of the vertical MOSFET. Such a size problem may be resolved by forming a region of the source electrode in a trench. Such a trench-shaped source electrode commonly employs a vertically laminated structure including an $n^+$ source region highly doped with n-type dopants and a $p^+$ source region highly doped with p-type dopants. Forming the trench-shaped source electrode in electrically contact with both the $n^+$ and $p^+$ source regions shortens the distance between the Schottky junction interface of the SBD and the bottom of the p type well, thereby reducing an electric-field relaxing effect of the p-type well and causing the deterioration of a breakdown voltage. Here, the Schottky junction uses the source electrode as a Schottky barrier metal.

BRIEF DESCRIPTION OF THE DRAWINGS

Aspects of this disclosure will become apparent upon reading the following detailed description and upon reference to the accompanying drawings.

DESCRIPTION

Figure 1:
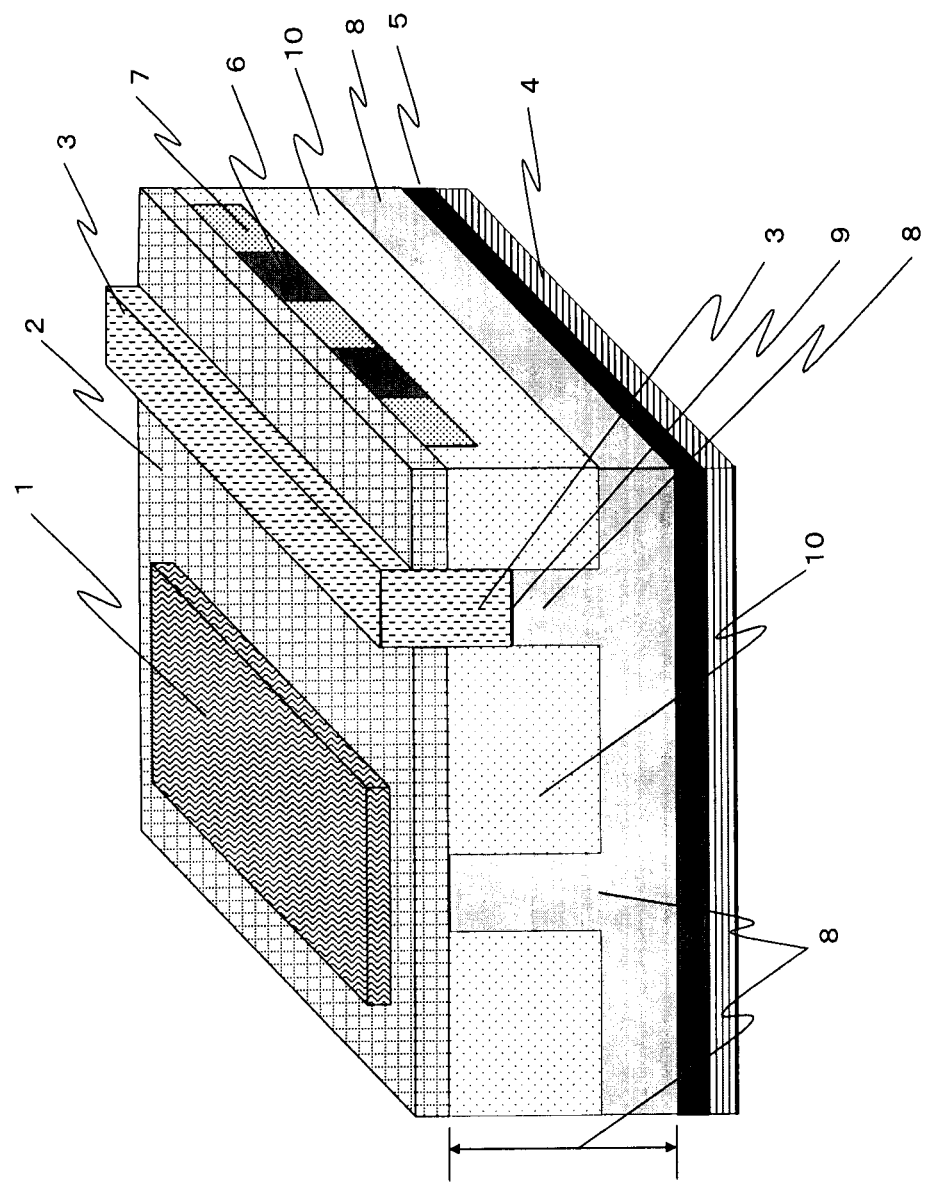
FIG. 1 is a perspective view showing an example of a semiconductor device in accordance with a first embodiment.

As will be described below, in accordance with an embodiment, a semiconductor device includes a first conduction type semiconductor substrate, a first conduction type semiconductor deposition layer, a trench, second conduction type wells, a JFET region, first conduction type first source regions, first source regions, a trench-type source electrode, a gate insulator film, a gate electrode, and a drain electrode. The first conduction type semiconductor deposition layer is formed on the substrate and having a dopant concentration lower than the dopant concentration of the substrate. The trench is formed substantially perpendicularly to the semiconductor deposition layer so that the semiconductor deposition layer exposes to a bottom of the trench. The second conduction type wells are formed in the semiconductor deposition layer so that each of the wells surrounds the trench except for a portion of the semiconductor deposition layer, the portion being in contact with the bottom. The JFET region separates the wells from each other and includes the semiconductor deposition layer. The first conduction type first source regions are formed in each of the wells and are in contact with sides of the trench. The second conduction type second source regions are formed in each of the first source regions being in contact with the sides and are separated from each other. The trench-type source electrode is formed inside the trench and is in contact with the first source regions, the second source regions, and the semiconductor deposition layer to configure a Schottky junction. The gate insulator film is formed over the first source regions, the second source regions, and the JFET regions. The gate electrode is formed on the gate insulator film. The drain electrode is formed on a back surface of the substrate.

Embodiments will be described with reference to the drawings. Wherever possible, the same reference numerals will be used to denote the same or like parts throughout the figures. The drawings are conceptual. Therefore, a relationship between the thickness and width of each portion and a proportionality factor among the respective portions are not necessarily the same as an actual one. Even when the same portions are drawn, their sizes or proportionality factors are represented differently from each other with respect to the drawings.

First Embodiment

A semiconductor device in accordance with a first embodiment includes the following main components. That is, the semiconductor device of the first embodiment includes two or more unit cells. Each of the unit cells includes a MOSFET of which base material is SiC and a Schottky barrier diode. A first conduction type semiconductor substrate refers to an n-type SiC substrate. A first conduction type semiconductor deposition layer refers to an n-type drift layer of SiC having a dopant concentration lower than the dopant concentration of the n-type SiC substrate. A second conduction type well refers to a p-type well region. A first source region of first conductive type in contact with the side of a trench-type source electrode refers to an n$^+$ source region having a high n-type dopant concentration. A second source region of second conductive type refers to a p$^+$ source region having a higher p-type dopant concentration. A JFET region is a portion of an n-type drift layer including an n-type dopant, which is located between two p-type wells or inside a p type well. The JFET region refers to a region in contact with channel regions coming up to the surfaces of the p-type wells by applying a gate voltage. The JFET region makes up a conduction path of electrons with the n$^+$ source region, the channel region, the n-type drift region, the SiC substrate, and the drain electrode.

FIG. 1 is a perspective view showing an example of the semiconductor device in accordance with the first embodiment. The perspective view shows a portion of a unit cell including a horizontal MOSFET and a Schottky barrier diode (SBD) adjacent to the MOSFET. The SBD includes a trench-type source electrode 3 as a metal electrode thereof. The side faces of the unit cell are drawn as the cross sections in FIG. 1. In the unit cell, an n-type drift layer 8 (the first conduction type semiconductor deposition layer) with a thickness of about 10 m is epitaxially grown to be deposited on the n-type SiC substrate 5 (the first conduction type semiconductor substrate) and a plurality of p-type wells 10 are formed within the n-type drift layer 8. An n$^+$ source region 6 and a p$^+$ source region 7 are formed around the surface of each of the p$^+$ type wells 10. The n$^+$ source region 6 is doped with an n-type dopant at a higher concentration and the p$^+$ source region 7 is doped with a p-type dopant at a higher concentration. As shown in FIG. 1, a portion of the n-type drift layer 8 is sandwiched horizontally between the two p-type wells 10 and is in contact with a gate insulator film 2 beneath a gate electrode 1.

Figure 2:
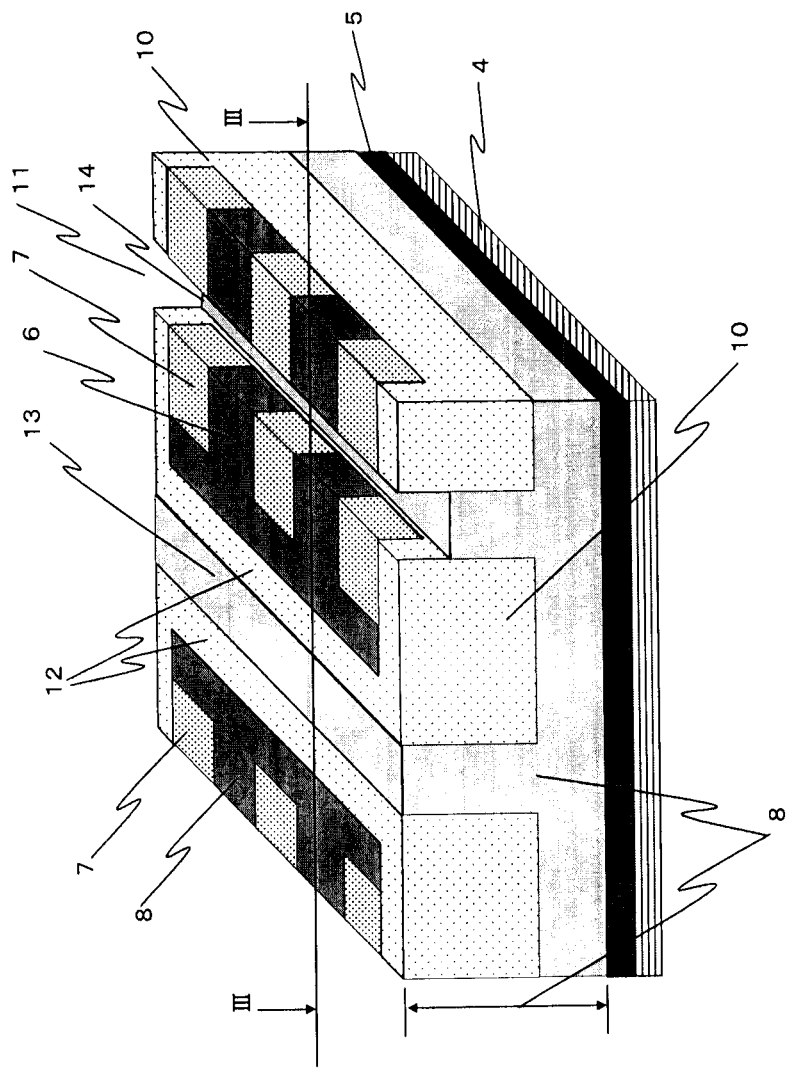
FIG. 2 is a perspective view drawn by excluding a gate electrode, a gate insulator film, and a trench-type source electrode in FIG. 1.

FIG. 2 is a perspective view drawn by excluding the gate electrode 1, the gate insulator film 2, and the trench-type source electrode 3 in FIG. 1. The perspective view shows the relative position of portions configuring the MOSFET (except for the gate electrode and the gate insulator film) and the SBD. As will be shown later in FIG. 3, a voltage of a threshold or higher applied to the gate electrode 1 inverts a surface portion of the p-type well to form a channel region 12. Electrons passing through the channel region 12 reach a drain electrode 4 via the JFET region 13, the n-type drift layer, and the n-type SiC substrate. A trench-type source electrode 3 shown in FIG. 1 is provided adjacent to the gate electrode 1. The n-type drift layer 8 is vertically carved between the two p-type wells or inside the p-type well so that the trench is formed. The trench-type source electrode 3 uses conducting materials including a metal and is in contact with the n-type drift layer 8 to configure a Schottky junction part (i.e, Schottky junction interface or Schottky barrier) 9. Specific materials of the trench-type source electrode 3 include Ni, a mixed material of Ni and Al, and polysilicon. Therefore, the SBD includes the trench-type source electrode 3, the Schottky junction part 9, and the n-type drift layer 8.

In FIG. 2, the n-type drift layer 8 exposes its surface to the outside at the bottom 14 of the trench 11. The n-type drift layer 8 is in contact with two or more p-type wells 10, the channel regions 12 to be produced around the surfaces of the p-type wells 10 just below the gate electrode 1, and the JFET region 13 between the p-type wells 10. That is, the trench 11 is formed by carving the surface of the n-type drift layer 8 in the depth direction. As a result, the bottom 14 of the trench 11 is an exposed surface of the n-type drift layer 8 as shown in FIG. 2. The n$^+$ source regions 6 and the p$^+$ source regions 7 are formed so as to be arranged alternately in a plane parallel to the n-type SiC substrate inside each of the p-type wells 10. The n$^+$ source regions 6 are further doped with an n-type dopant and the p$^+$ source regions 7 are further doped with a p-type dopant at a concentration higher than the concentration of p-type dopant in the p-type wells 10. The p$^+$ source regions 7 are to discharge holes to ground via the trench-type source electrode 3. The holes are accumulated inside the p-type wells 10 during operation of the MOSFET. The n$^+$ source regions 6 in contact with the channel regions 12 serve as a substantial source region.

Several technical points in manufacturing the unit cell will be described below. Firstly, a 10 μm-thick n-type drift layer 8 is epitaxially grown on a low-resistance n-type SiC substrate 5 while being doped with an n-type dopant, e.g., nitrogen, at a concentration of $5 \times 10^{15}/cm^3$. Thickening the n-type drift layer 8 and lowering the dopant concentration of the n-type drift layer 8 can provide a high breakdown-voltage device. Secondly, Al ions are implanted in the formation-predetermined regions for the p-type wells 10 via the surface of the n-type drift layer 8 to form the p type wells 10. Thirdly, the n$^+$ source region 6 and the p$^+$ source regions 7 are further formed in each of the p-type wells 10. In order to form the n$^+$ source regions 6, n-type dopants are selectively implanted in the formation-predetermined region for the n$^+$ source region 6 at a concentration of about $10^{21}/cm^3$. After the n-type dopant implantation, Al ions are implanted as a p-type dopant in the formation-predetermined regions for the $p^+$ source regions 7 at a concentration higher than the concentration of the n-type dopant in the $n^+$ source region 6. At that time, the Al-ion are implanted in the $p^+$ source regions 7 a little more deeply than in the previously formed $n^+$ source region 6. The Al-ion doping is conducted using a mask corresponding to the $p^+$ source regions 7. Thus, as shown in FIG. 2, the p-type wells 10 are formed in the n-type drift layer 8. Furthermore, the $n^+$ source regions 6 and the $p^+$ source regions 7 are formed at a relatively shallow position from the surface of the p-type well 10 to be arranged alternately like a belt in a plane parallel to the SiC substrate 5. The trench 11 is formed after the formation of the $n^+$ source region 6 and $p^+$ source regions 7. After the ion implantation and the trench formation, the whole SiC substrate is washed with chemicals, thereby removing organic and metallic residues, e.g., fine dust particles. Subsequently, the whole SiC substrate is subjected to activation annealing so that dopants are placed in stable crystal lattice sites of the SiC substrate. The activation annealing is conducted, e.g., for 30 min, in an argon atmosphere, at a temperature of 1500° C. or higher.

Figure 3:
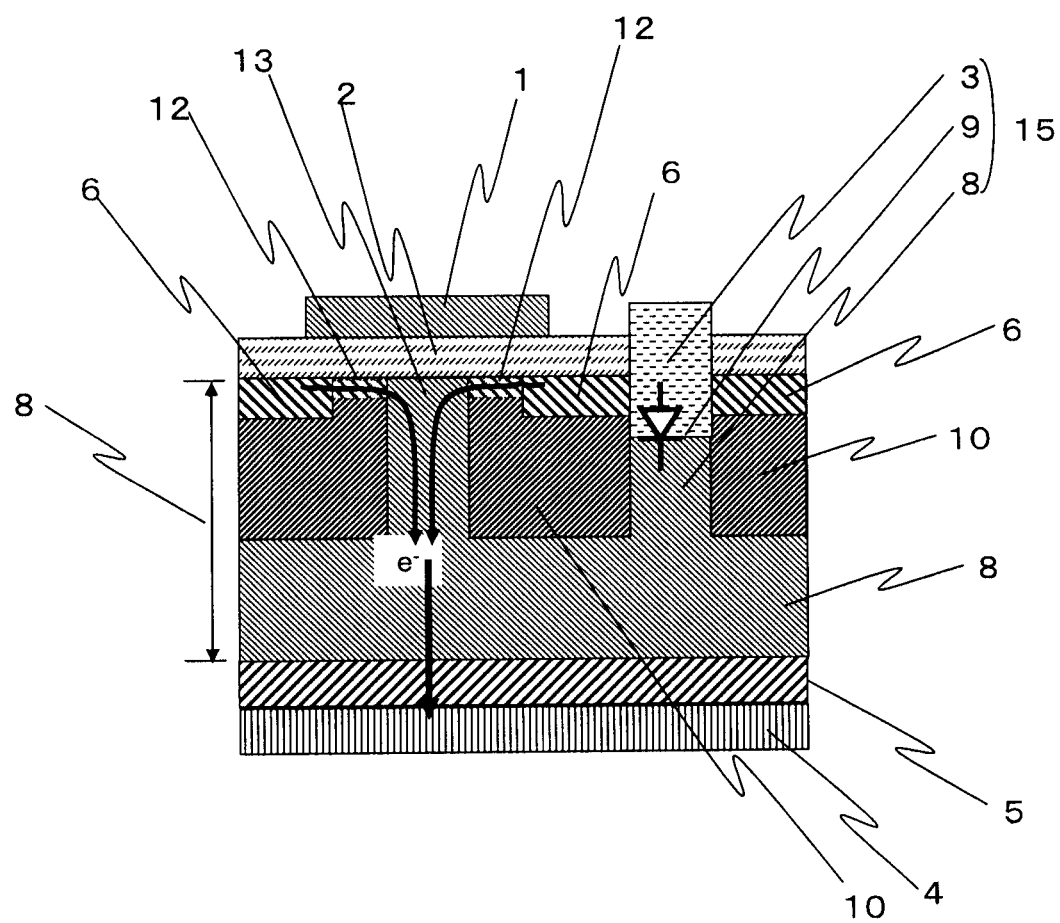
FIG. 3 is a sectional view of a MOSFET and a Schottky barrier diode included in a semiconductor device of the first embodiment.

FIG. 3 is a sectional view of the MOSFET and the SBD included in a semiconductor device of the first embodiment, both being cut along the line III-III in FIG. 2. A trench-type source electrode 3 and the n-type drift layer 8 in contact therewith configures the Schottky junction part (junction interface) 9, thereby providing the Schottky barrier diode (SBD) 15. The forward direction of the SBD 15 is denoted by a symbol of diode as shown in FIG. 3. The symbol is fixed just at the Schottky junction part 9. A current flows in the forward direction of from the trench-type source electrode 3 to the n-type drift layer 8. In FIG. 3, the MOSFET is formed adjacent to the SBD 15. A positive voltage of a threshold or more is applied to the gate electrode 1 to invert the channel 12 1 from the p type to an n type just below the gate electrode to create an electron path. Electrons having passed through the channel 12 reach the drain electrode 4 via the n-type JFET region by the voltage applied between the trench-type electrode 3 (grounded) and the drain electrode 4. That is, the MOSFET includes the gate electrode 1, the gate insulator film 2, the trench-type source electrode 3, the channel 12, the JFET region 13, the n-type drift layer 8, the n-type SiC substrate 5, and the drain electrode 4. Tunneling through the Schottky barrier between the trench-type source electrode 3 and the $n^+$ source region 6 allows electrons to inflow from the trench-type source electrode 3 to the $n^+$ source region 6 containing high-density impurities.

Figure 4:
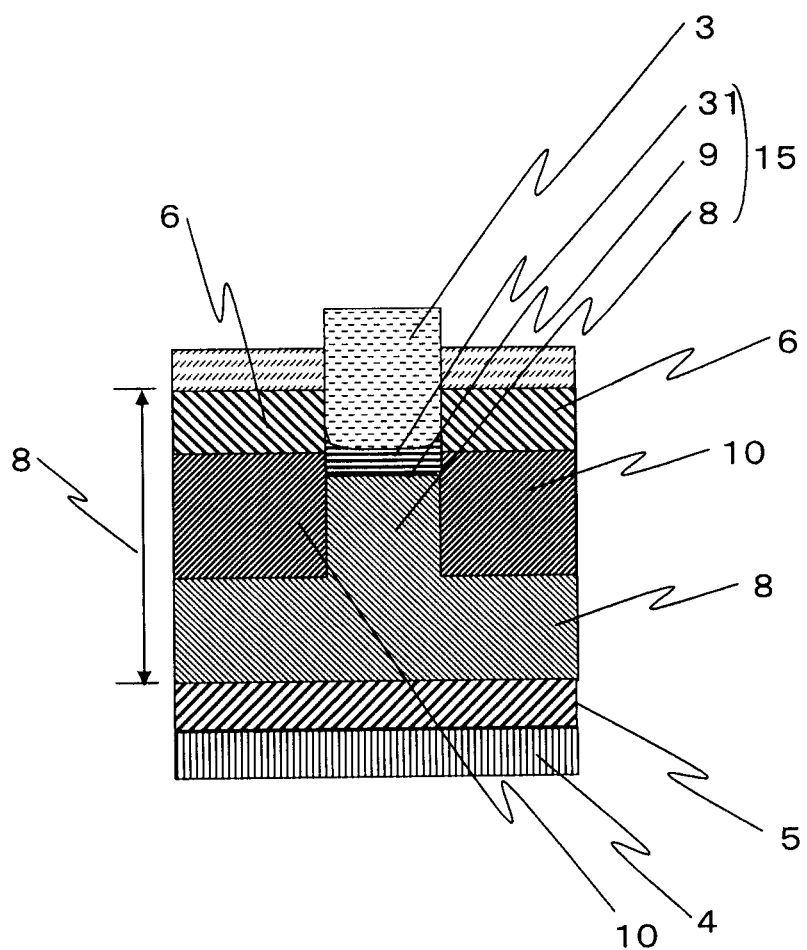
FIG. 4 is a sectional view showing an example for a trench-type source electrode including two kinds of metallic layers.

Materials of the trench-type source electrode 3 include pure Ni, a mixed material of Ni and Al, and polysilicon. On the other hand, when another material different from the materials is prepared on the bottom 14 of the trench 11 before forming the trench-type source electrode 3, the material enables it to reduce the rising voltage or the reverse leakage current of the SBD. The trench-type source electrode 3 is in contact with the n-type drift layer 8 at the bottom 14 of the trench 11 (FIG. 2) and is also in contact electrically with both the $n^+$ source regions 6 and the $p^+$ source regions 7 at the both sides of the trench 11 (FIG. 2). The trench-type source electrode 3 can have a double-layer structure. One of the two layers is in contact with the n-type drift layer 8 to configure a Schottky junction at the bottom 14. The other is in contact with both the $n^+$ source regions 6 and the $p^+$ source regions 7 to form an ohmic contact to the both regions 6, 7. FIG. 4 is a sectional view showing an example for the trench-type source electrode 3 including two kinds of metallic layers. The JFET region 13 and the gate electrode 1 are not shown in FIG. 4. The lower portion of the trench-type source electrode 3 includes the material different from that of the upper portion thereof to form the Schottky junction part 9. The lower portion is referred to as a Schottky metal layer 31 in FIG. 4. That is, the SBD 15 includes the Schottky metal layer 31 and the n-type drift layer 8. A metal having a large work function is employed for the Schottky metal layer 31 to reduce the reverse leak current (i.e. tunnel current) of the SBD 15. On the other hand, a metal having a small work function is employed for the trench-type source electrode 3 except for the Schottky metal layer 31 to provide the ohmic contact with both the $n^+$ source region 6 and the $p^+$ source regions 7.

Figure 5:
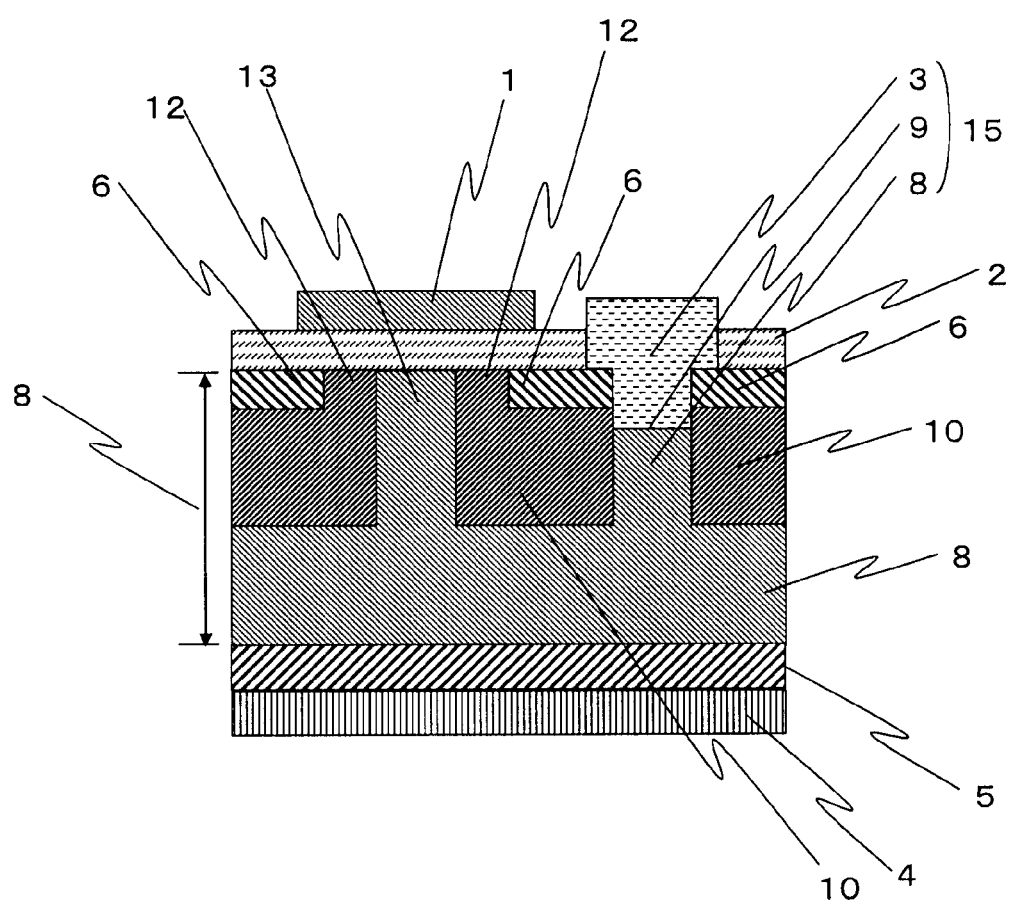
FIG. 5 is a sectional view of the MOSFET and the Schottky barrier diode included in the semiconductor device of the first embodiment.

FIG. 5 is a sectional view of the MOSFET and the SBD included in the semiconductor device of the first embodiment, showing a T-shaped trench-type source electrode 3. The MOSFET and the SBD are cut along the line in FIG. 2. The sectional view shows that the section of the trench-type source electrode 3 has a T-shape which provides a larger-area electrical contact between the trench-type source electrode 3 and the $n^+$ and $p^+$ source regions 6, 7. The electrical contact is due to not only the sides of the trench-type source electrode 3 but also the surface portions of the $n^+$ and $p^+$ source regions 6, 7. The larger-area electrical contact reduces the contact resistance between the trench-type source electrode 3 and the $n^+$ and $p^+$ source regions 6, 7, thereby enabling it to prevent the ON-state characteristics of the MOSFET from deteriorating.

Here, the contact resistance between the trench-type source electrode 3 and the $n^+$ source region 6 is evaluated as an influence on the ON-state characteristics of the MOSFET as follows. A ratio of the contact resistance of the $n^+$ source region 6 to the whole resistance of the MOSFET is estimated to be about 2%, provided that a horizontal MOSFET has a series resistance of 5 $m\Omega/cm^2$ and a contact resistance between an $n^+$ source region and a trench-type source electrode of the vertical MOSFET is 0.1 $m\Omega/cm^2$. Here the $n^+$ source regions 6 and the $p^+$ source regions 7 are assumed to be in contact with the sides of the trench-type source electrode 3 alternately as described in the first embodiment. Therefore, the contact area of the $n^+$ source regions 6 to the trench-type source electrode 3 is decreased by half. In this case, the contact resistance between the $n^+$ source regions 6 and the trench-type source electrode 3 is decreased also by half. This means that the contact resistance of the $n^+$ source region 6 to the whole resistance of the MOSFET is estimated to be about 4%. An increase in the contact resistance between the $n^+$ source regions 6 and the trench-type source electrode 3 is estimated to be at most about 4% even without employing the T-shaped trench-type source electrode. The increase causes almost no deterioration of ON-state characteristics of the horizontal MOSFET in comparison with the vertical MOSFET of the background art. When the T-shaped trench-type source electrode 3 is employed, the upper surface and the trench sides of the $n^+$ source regions 6 can be in contact with the T-shaped trench-type source electrode 3, thereby suppressing the increase in the contact resistance. Therefore, the T-shaped trench-type source electrode 3 enables it to further lower the resistance of the whole semiconductor device.

Switching operation of this "horizontal" SiC MOSFET of the present embodiment will be described below.

First, when the gate electrode is in an ON-state and a gate voltage of the threshold or more is applied thereto, electrons are induced on the surface of the p-type wells 10 to create the channel regions 12 in FIG. 3. The channel region 12 is formed by inverting the p-type surface portion of the p-type well 10 to an n-type region to thereby provide a path through which electrons can pass. The path allows a current to flow into the trench-type source electrode 3 from the drain electrode 4. For the current flowing, the JFET region 13 provides a high mobility as being an epitaxially grown layer with a low impurity concentration and less dense lattice defects.

On the other hand, a current does not pass through the MOSFET in an OFF-state of the gate. When the gate is in the OFF-state, a positive voltage is inevitably applied to the drain electrode 4 with respect to the trench-type source electrode 3. At that time, a reverse voltage is applied to the Schottky junction 9. A Schottky junction commonly has a reverse breakdown voltage lower than that of a p-n junction. That is, it is likely that the Schottky junction 9 has a lower reverse breakdown voltage than a parasitic p-n junction formed of the p-type well 10 and the n-type drift layer 8 in the horizontal MOSFET of this embodiment. However, the Schottky junction 9 is located at the uppermost portion of the n-type drift layer 8 and surrounded by the p-type wells 10, being distant from the drain electrode 4. The Schottky junction interface 9 distantly-located creates an electric field relaxing effect of a reverse bias field applied to the Schottky junction interface 9. Such a horizontal MOSFET can enhance substantially the breakdown voltage of the Schottky barrier included therein. That is, the horizontal MOSFET includes the $n^+$ source regions 6 and the $p^+$ source regions 7 both being arranged alternately horizontally around the surface of the horizontal MOSFET, thereby allowing the Schottky junction 9 to be distant from the drain electrode 4. In this respect, the horizontal MOSFET is quite different from the vertical MOSFET of the background art having an $n^+$ source region and a $p^+$ source region laminated vertically. The horizontal MOSFET allows relaxing of a reverse electric field applied to the Schottky junction 9 included therein, thereby enhancing the reverse breakdown voltage of the Schottky junction 9. The first embodiment employs the trench-type source electrode 3 to save the area occupied by the MOSFET and the built-in SBD adjacent thereto. In addition, the MOSFET of the first embodiment has the $n^+$ source regions 6 and the $p^+$ source regions 7 arranged alternately vertically around the surface of the MOSFET, thereby suppressing a reduction in the reverse breakdown voltage of the SBD formed at the bottom 14 of the trench-type source electrode 3.

Figure 6:
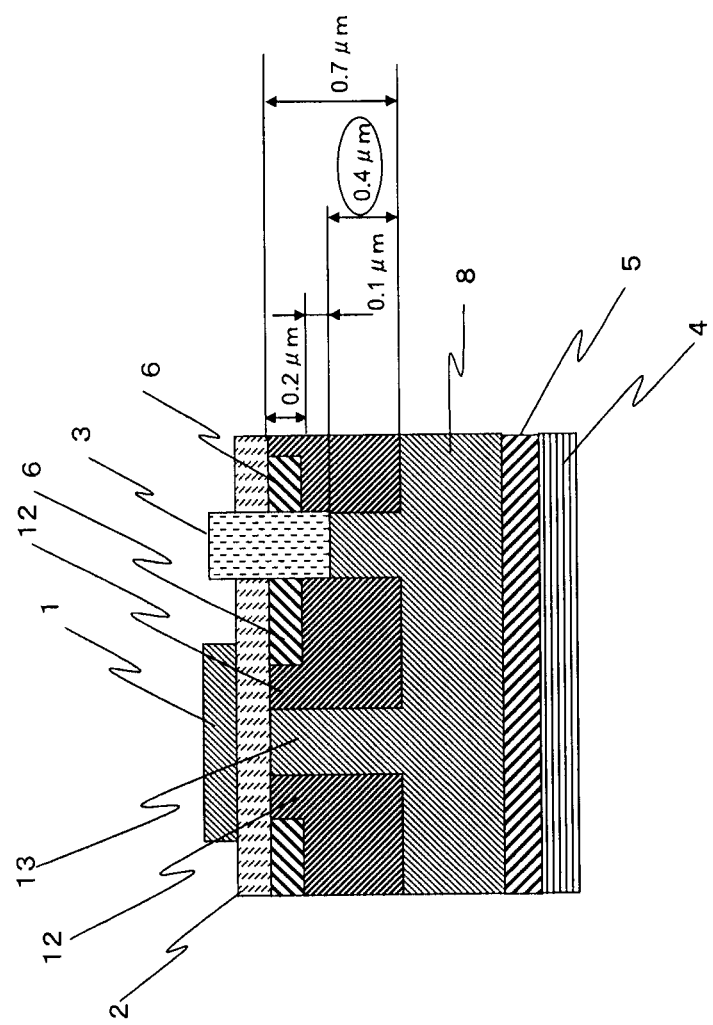
FIG. 6 is a view showing a dimension example of the horizontal MOSFET and the built-in Schottky barrier diode of the first embodiment.
Figure 7:
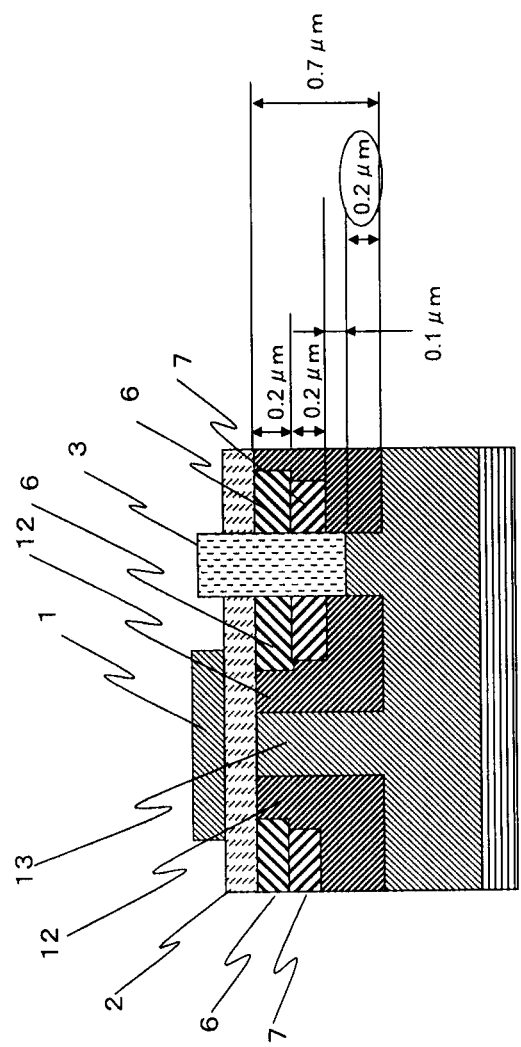
FIG. 7 is a sectional view showing a dimension example of a vertical MOSFET of the background art.

FIG. 6 is a view showing a dimension example of the horizontal MOSFET and the built-in SBD of the first embodiment in which the p-type well 10, the $n^+$ source region 6, and the $p^+$ source region 7 have depths of 0.7 µm, 0.2 µm, and 0.2 µm, respectively. General-purpose ion implantation equipment can implant Al ions to SiC by a depth of about 0.7 µm as a p-type dopant. A distance between the Schottky junction interface 9 and the bottom of the p-type well 10 can be 0.4 µm, provided that the margin of the bottom of the trench-type source electrode 3 is 0.1 µm to the bottoms of the $n^+$ and $p^+$ source regions 6, 7. In contrast, forming a Schottky junction interface at the bottom of a trench-type source electrode 3 in a vertical MOSFET of the background art provides no more than 0.2 µm as a distance between the Schottky junction interface and the bottom of the p-type well as shown in FIG. 7. Therefore, the vertical MOSFET of the background art causes an electric field concentration more easily than the SBD built in the semiconductor device of the present embodiment. FIG. 7 is a sectional view showing a dimension example of the vertical MOSFET of the background art. The background art may still have a choice to increase the distance between the Schottky junction interface 9 and the bottom of the p-type well 10. In such a case, a current path becomes longer in the JFET region 13 just below the gate, thereby increasing the on-resistance of the vertical MOSFET.

When the MOSFET is in an OFF-state and a negative voltage is inevitably applied between the drain electrode 4 and the trench-type source electrode 3, a current passes through the built-in diode. At that time, a parasitic p-n junction and a Schottky barrier diode SBD are arranged between the trench-type source electrode 3 and the drain electrode 4. The parasitic p-n junction is configured by the p-type well 8 and the n-type drift layer 9. As mentioned above, the SBD is configured by the trench-type source electrode 3 and the n-type drift layer 8. These two kinds of diodes are in parallel with each other. The SBD has a lower forward rising voltage than the parasitic p-n junction. Therefore, the parallelly-connected diodes serve simply as a Schottky barrier diode. The rising voltage allowing electrons to pass through the SBD is 1.5V or less and enables a lower loss of the semiconductor device of the first embodiment during power supply than the semiconductor device of the background art. The semiconductor device of the background art includes a p-n junction having a higher rising voltage of 2.5V to 3.0V. The SBD eliminates accumulation of minority carriers (holes) during power supply inside the n-type drift layer. Therefore, the semiconductor device of the first embodiment includes nothing but electrons as carries. The accumulation commonly prevents a MOSFET having a p-n junction from operating rapidly. In this respect, the SBD does not prevent the horizontal MOSFET from operating rapidly. As a result, the MOSFET including the built-in SBD is enabled to have a high breakdown voltage at high-speed and a low power consumption.

As is described above, the present embodiment has the $n^+$ source regions 6 and the $p^+$ source regions 7 not vertically laminated. In this respect, the embodiment is different from the background art and the $n^+$ source regions 6 and the $p^+$ source regions 7 are arranged alternately horizontally around the surface of the horizontal MOSFET, thereby allowing the Schottky junction 9 to be distant from the drain electrode 4. The horizontal arrangement allows relaxing of a reverse electric field applied to the Schottky junction 9 included therein, thereby enhancing the reverse breakdown voltage of the Schottky junction 9. In addition, the source electrode is of trench type, thereby allowing it to make an area occupied by an SBD small. This trench-type source electrode can also suppress an increase in a half pitch of unit cell and is advantageous for large current capacity required in an inverter application. The $n^+$ source region 6 and $p^+$ source region 7 are arranged in an identical plane, thereby allowing it to make the ohmic contact between the trench-type source electrode 3 and the sidewalls of the $n^+$ and $p^+$ source regions 6, 7.

Second Embodiment

Figure 8:
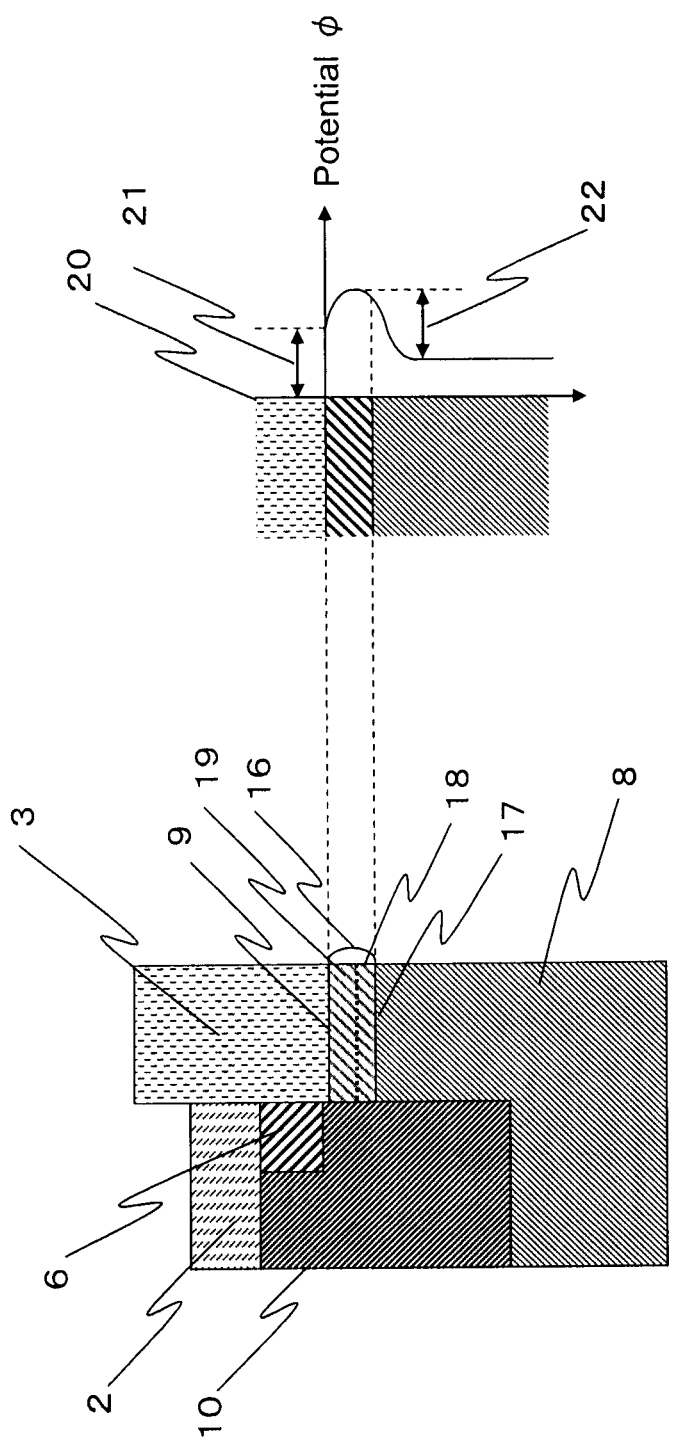
FIG. 8A is a sectional view showing a region around a Schottky junction interface below which a p-type layer is supplementarily formed.
FIG. 8B is a band diagram showing the energy band structure of the Schottky barrier diode shown in FIG. 8A in thermal equilibrium.

A second embodiment is provided supplementarily with a p-type layer 16 by doping the surface of the n-type drift layer 8 with a p-type dopant in order to enhance a reverse breakdown voltage of an SBD having a Schottky junction interface 9 inside the p-type well 10. The p-type layer 16 doped is provided between the Schottky junction interface 9 and the n-type drift layer 8. For example, the following two conditions can deplete entirely the p-type layer 16 in thermal equilibrium. (1) The n-type dopant concentration of the n-type drift layer 8 is set to be $5 \times 10^{15}/cm^3$. (2) The thickness and the p-type dopant concentration of the p-type layer 16 just below the Schottky junction interface 9 are set to be 200 nm and $1 \times 10^{16}/cm^3$, respectively. FIG. 8A is a sectional view showing a region around the Schottky junction interface 9 below which the p-type layer 16 is supplementarily formed by preliminarily doping the surface of the n-type drift layer 6 with a p-type dopant. That is, the p-type layer 16 is formed between the Schottky junction interface 9 and the n-type drift layer 8. FIG. 8B is a band diagram showing an energy band structure of the SBD shown in FIG. 8A in thermal equilibrium. As the band diagram shows, a constant Fermi level in thermal equilibrium forms a transition region having a potential gradient around the p-n junction interface 17 between the n-type drift layer 8 and the p-type layer 16. In the transition region, a depletion layer lacking carriers is formed over the n-type drift layer 8 and the p-type layer 16. The two potential gradients around the p-n junction interface 17 and the Schottky junction interface 9 form a potential barrier to an electron in the n-type drift layer 8 around the p-type layer 16. The barrier height (VBH) 22 of the potential barrier to an electron can be controlled to be lower than a built-in potential between the n-type drift layer 8 and the p-type layer 16. The built-in potential refers to a potential difference of the n-type drift layer 8 from the p-type layer 16 when a p-n junction is formed between the n-type drift layer 8 and the p-type layer 16 instead of a Schottky junction between the p-type layer 16 and the Schottky metal electrode 31. The potential gradient of the p-type layer 16 configuring the Schottky junction 9 reduces the potential barrier (VBH) 22. As a result, VBH 22 is controlled to be lower than the built-in potential between the n-type drift layer 8 and the p-type layer 16. When the p-type dopant concentration and the thickness of the p-type layer are controlled, the potential barrier height VBH 22 can be controlled freely in the range from the barrier height ((pBn) of the Schottky junction interface 9 to the built-in potential.

When a forward voltage is applied between the Schottky metal electrode 31 and the n-type drift layer 8, the forward voltage is applied mostly to the junction of the p-type layer and the n-type drift layer 8 so as to lower the height of VBH 22. As a result, electrons in the n-type drift layer 8 can get over the potential barrier of the p-type layer 16 to flow into the Schottky metal electrode 3. Accordingly, electrons diffuse from the n-type drift layer 8 to the p-type layer 16 so that a forward current passes through the diode. At that time, a voltage drop, i.e., an on-resistance can be reduced just for that the potential barrier height (VBH) 22 can be controlled to be lower than the built-in potential between the n-type drift layer 8 and the p-type layer 16.

On the other hand, when a reverse voltage is applied between the Schottky metal electrode 31 and the n-type drift layer 8, the reverse voltage is applied mostly to the junction of the p-type layer and the n-type drift layer 8. The n-type drift layer 8 and the p-type layer 16 configure a one-sided abrupt junction so that a sufficiently large depletion layer extends to the n-type drift layer 8. As a result, the breakdown voltage can be enhanced with respect to the reverse voltage. In addition, the reverse voltage is applied mostly to the depletion layer expanding in the n-type drift layer 8 and is hard to apply to the p-type layer 16 of which entire region has been depleted. The potential barrier height at the p-type layer 16 can be suppressed to a minimal decrease, thereby allowing it to suppress a decrease in the reverse breakdown voltage to a low level and an increase in a leakage current simultaneously. The potential barrier has a gently-sloping shape to an electron so that the transmission length in electron tunneling of the potential barrier becomes longer than that in electron tunneling when a reverse voltage is applied to a single Schottky barrier diode including the p-type layer 16 and the Schottky metal electrode 31. It is hard for electrons to tunnel such a potential barrier having the gently-sloping shape. Accordingly, a leakage current (due to the electron tunneling) can be suppressed.

Third Embodiment

Figure 9:
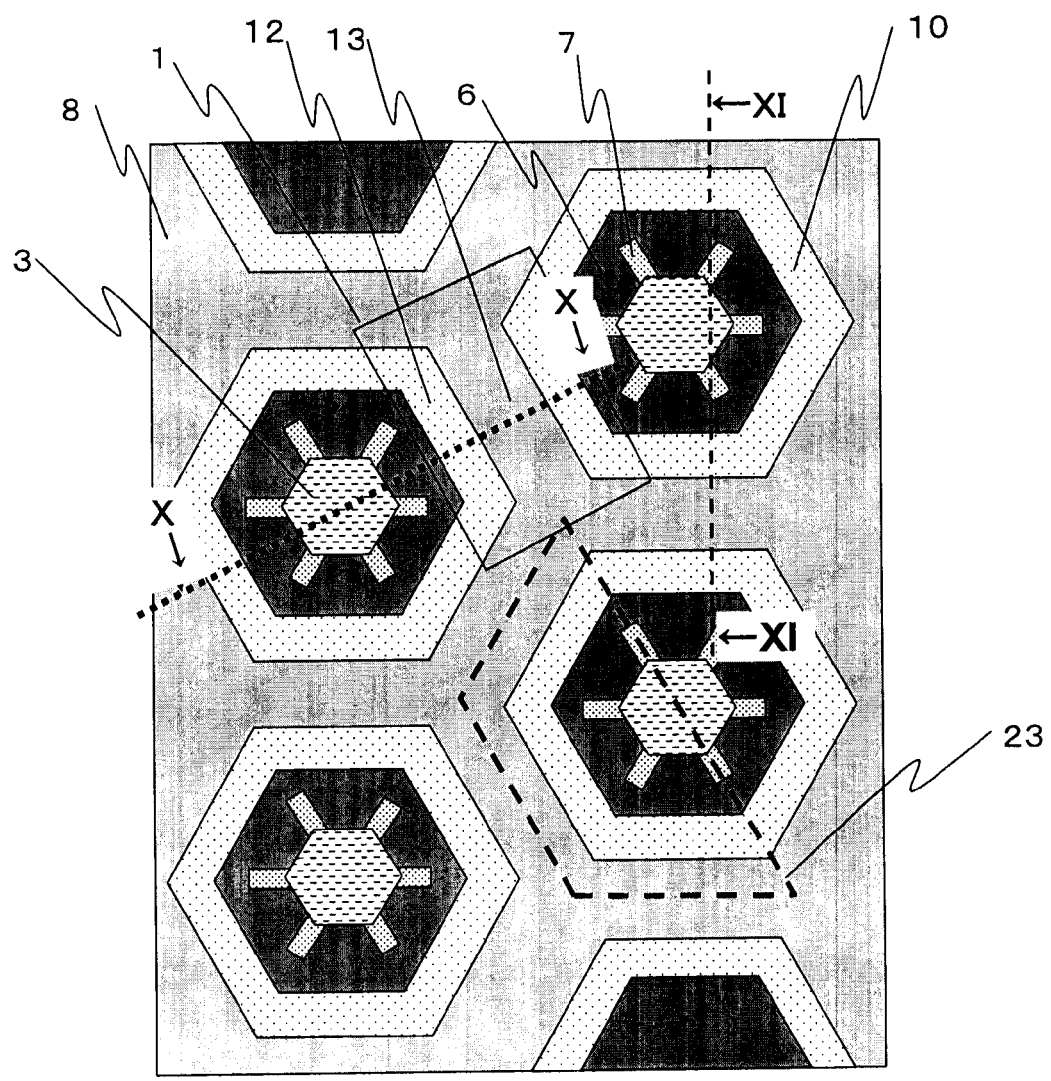
FIG. 9 is a top view of a MOSFET with a built-in Schottky barrier diode in accordance with a third embodiment.

FIG. 9 is a top view of a MOSFET including a built-in SBD in accordance with a third embodiment. In the third embodiment, a p-type well 10 is formed in a hexagonal shape to allow close packing. An n$^+$ source regions 6 similar to the p-type well 10 and p$^+$ source regions 7 are formed inside the p-type well 10. The p$^+$ source regions 7 are formed radially in an in-plane direction from a trench-type source electrode 3. In addition, the trench-type source electrode 3 is formed in the central area of the p-type well 10. In the third embodiment, a gate electrode 1 is formed in a boxed area in FIG. 9 via a gate insulator film. The gate insulator film is not shown in FIG. 9. In addition, channel regions 12 and a JFET region 13 are located under the gate electrode 1. When a voltage of a threshold value or more is applied to the gate electrode 1, electrons flowing out of the n$^+$ source regions 6 pass through the channel regions 12 and reach the JFET region 13. The electrons further move down vertically to reach a drain electrode not shown in FIG. 9. Even when a position of the trench-type source electrode 3 is displaced to a certain degree, the displacement is expected to have almost no influence on characteristics of the MOSFET and the SBD included in the semiconductor device from the view point of the shape aspect of the third embodiment. Therefore, the shape aspect of the third embodiment enables robust design of the semiconductor device in accordance therewith.

In the third embodiment, a unit cell is denoted as an area 23 by the dotted line and shows that an active region to control a current can be downsized, thereby enabling it to pass a larger current through the semiconductor device of the same size. When handling the same current capacity, it is possible to downsize the semiconductor device as a whole.

Figure 10:
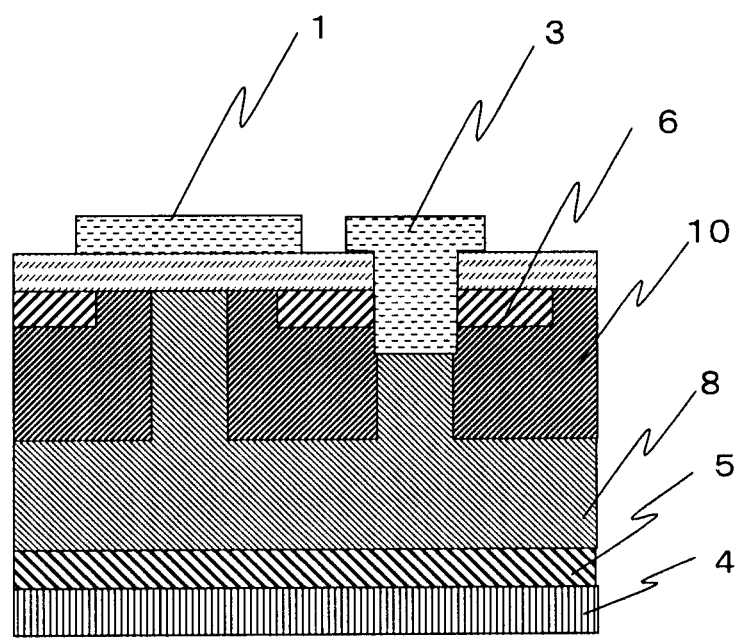
FIGS. 10 and 11 are sectional views cut along dotted lines X-X and XI-XI in FIG. 9, respectively.
Figure 11:
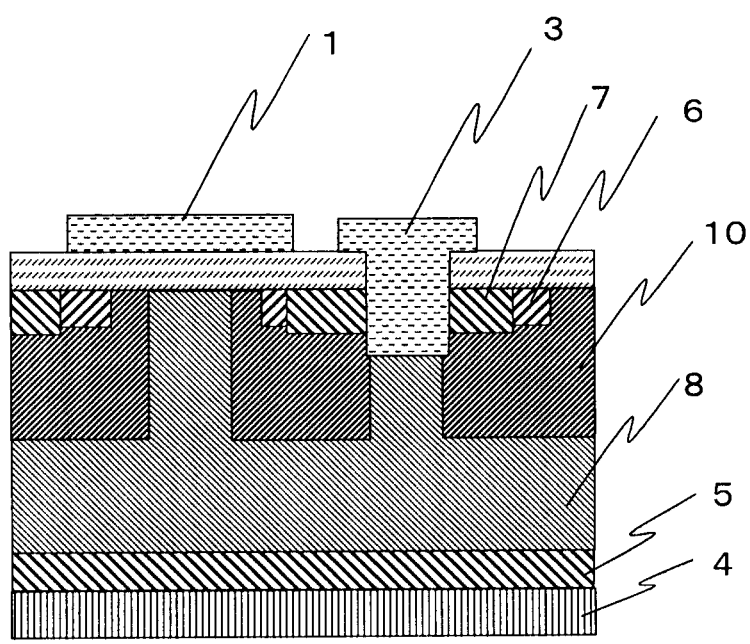

FIGS. 10 and 11 are sectional views cut along dotted lines X-X and XI-XI in FIG. 9, respectively. The sectional views are the same as the main portions and regions of the semiconductor device in accordance with the first embodiment as shown in FIG. 3. The MOSFET and the SBD are configured basically in the same way as in the first embodiment. However, the trench-type source electrode 3 formed as being T-shaped enables it to reduce a contact resistance of the trench-type source electrode 3 to the n$^+$ source regions 6 and the p$^+$ source regions 7.

Another semiconductor device includes a first conduction type semiconductor substrate, a first conduction type semiconductor deposition layer, a first trench, second conduction type wells, a JFET region, a first conduction type first source region, a second conduction type second source region, a trench-type source electrode, a second trench, a gate insulator film, a gate electrode, and a drain electrode. The first conduction type semiconductor deposition layer is formed on the substrate and has a dopant concentration lower than the dopant concentration of the substrate. The first trench is formed substantially perpendicularly to the semiconductor deposition layer so that the semiconductor deposition layer exposes to a bottom of the trench. The second conduction type wells are formed in the semiconductor deposition layer so that each of the wells surrounds the trench except for a portion of the semiconductor deposition layer, the portion being in contact with the bottom. The JFET region separates the wells from each other and is included in the semiconductor deposition layer. The first conduction type first source region is formed in each of the wells and is in contact with sides of the trench. The second conduction type second source region is formed in the first source region and is in contact with the sides. The trench-type source electrode is formed inside the trench and in contact with the first source region, the second source region, and the semiconductor deposition layer to configure a Schottky junction. The second trench is formed in the JFET region lying between two of the second conduction type wells, the two being adjacent to each other. The gate insulator film is formed on surfaces of the first source region and the second source region, and on sidewalls and a bottom of the second trench. The second source region is included in the second conduction type wells. The gate electrode is formed on the gate insulator film. The drain electrode is formed on a back surface of the substrate. In addition, the second trench extends in a depth direction of the JFET region and to a depth below a bottom of the second conduction type wells. Furthermore, applying a voltage to the gate electrode allows a channel region to be formed in the second conduction type wells.

While certain embodiments have been described, those embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
  a semiconductor deposition layer with a first conductivity type provided on a semiconductor substrate with a first conductivity type, and having an impurity concentration lower than that of the semiconductor substrate;
  a first well with a second conductivity type and a second well with a second conductivity type separated from the first well, the first and second wells being provided in a surface of the semiconductor deposition layer, the first well being provided so as to surround a first trench which is formed substantially perpendicularly in the surface of the semiconductor deposition layer, the second well being provided so as to surround a second trench which is formed substantially perpendicularly in the surface of the semiconductor deposition layer, a depth of the first and second wells being deeper than that of the first and second trenches;
  a gate electrode provided on a gate insulator film;
  a first source region with a first conductivity type and a second source region with a second conductivity type, the first and second source regions being provided in a surface of each of the first and second wells, the first source region having an impurity concentration higher than that of the semiconductor deposition layer, the second source region having an impurity concentration higher than that of the first and second wells, a depth of the first and second source regions being shallower than that of the first and second trenches, the first and second source regions being provided so as to surround and be close each of the first and second trenches;
  a first trench-type source electrode buried so as to cover the first trench, a second trench-type source electrode being buried so as to cover the second trench; and
  a drain electrode provided on a back surface of the semiconductor substrate.

2. The device according to claim 1, wherein
  the first and second source regions are alternately repeatedly provided so as to surround each of the first and second trenches.
3. The device according to claim 1, wherein
  the first and second source regions are alternately repeatedly provided in a direction parallel to an extension direction of the gate electrode.
4. The device according to claim 1, wherein
  the gate electrode is provided on a first portion as being the semiconductor deposition layer between the first well and the second well, a second portion as being the first well between the first portion and the first source region of the first well, and a third portion as being the second well between the third portion and the first source region of the second well, through the gate insulating film, so as to overlap the first source region of the first well and the first source region of the second well.
5. The device according to claim 1, wherein
  the semiconductor device is composed of a plurality of cells, each sells includes a MOSFET and a Schottky barrier diode (SBD).
6. The device according to claim 5, wherein
  the semiconductor deposition layer under a bottom of the first trench is Schottky-connected to the first trench-type source electrode,
  the semiconductor deposition layer under a bottom of the second trench is Schottky-connected to the second trench-type source electrode, and
  the first and second source regions are ohmic-connected to each of the first and second trench-type source electrode.
7. The device according to claim 5, wherein
  the semiconductor device turns on when a voltage is applied to the gate electrode and the drain electrode, a current is flowed from the drain electrode to the first source region of the first well and the first source region of the second well, through the semiconductor deposition layer, the first well, and the second well.
8. The device according to claim 5, wherein
  the semiconductor device is a SiC vertical type MOSFET.
9. The device according to claim 1, wherein
  the first and second wells have the same configuration,
  the first and second trenches have the same configuration.
10. The device according to claim 1, further comprising:
  a Schottky-metal layer provided between a bottom of the first trench and the first trench-type source electrode, and between a bottom of the second trench and the second trench-type source electrode, wherein
  a work function of the Schottky-metal layer is larger than that of the first and second trench-type source electrodes.
11. The device according to claim 1, wherein
  a depth of the second source region is deeper than that of the first source region.
12. The device according to claim 1, wherein
  the first and second trench-type source electrodes are composed of any of nickel (Ni), a mixture of Ni and aluminum (Al), and a polycrystalline silicon.
13. The device according to claim 1, further comprising a second conduction type doped layer formed between the first and second source electrodes and the semiconductor deposition layer.

* * * * *